(12) United States Patent
Park

(10) Patent No.: US 9,758,698 B2
(45) Date of Patent: Sep. 12, 2017

(54) POLISHING SLURRY AND SUBSTRATE POLISHING METHOD USING THE SAME

(71) Applicant: UBMATERIALS INC., Yongin-Si, Gyeonggi-Do (KR)

(72) Inventor: Jin Hyung Park, Ulsan (KR)

(73) Assignee: UBMATERIALS INC. (KR)

( * ) Notice: Subject to any disclaimer, the term of this patent is extended or adjusted under 35 U.S.C. 154(b) by 0 days.

(21) Appl. No.: 15/073,625

(22) Filed: Mar. 17, 2016

(65) Prior Publication Data

US 2016/0272847 A1 Sep. 22, 2016

(30) Foreign Application Priority Data

Mar. 20, 2015 (KR) .......................... 10-2015-0038930

(51) Int. Cl.
| | | |
|---|---|---|
| *H01L 21/302* | (2006.01) | |
| *H01L 21/461* | (2006.01) | |
| *C09G 1/02* | (2006.01) | |
| *H01L 21/321* | (2006.01) | |

(52) U.S. Cl.
CPC ............ *C09G 1/02* (2013.01); *H01L 21/3212* (2013.01)

(58) Field of Classification Search
USPC ........................................................ 438/693
See application file for complete search history.

(56) References Cited

U.S. PATENT DOCUMENTS

2002/0096659 A1* 7/2002 Sakai ....................... C09G 1/02
252/79
2013/0186850 A1 7/2013 Wang et al.

FOREIGN PATENT DOCUMENTS

| JP | 2005129951 A | 5/2005 |
|---|---|---|
| JP | 2014229827 A | 12/2014 |
| KR | 20070055770 A | 5/2007 |
| KR | 20140079001 A | 6/2014 |
| KR | 101406758 B1 | 7/2014 |
| TW | 201116614 A1 | 5/2011 |
| TW | 201311841 A1 | 3/2013 |
| WO | 2012102180 A1 | 8/2012 |

\* cited by examiner

*Primary Examiner* — Roberts Culbert
(74) *Attorney, Agent, or Firm* — Renaissance IP Law Group LLP

(57) ABSTRACT

Provided are slurry for polishing cobalt and a substrate polishing method. The slurry includes an abrasive configured to perform the polishing, the abrasive comprising zirconium oxide particles, a dispersing agent configured to disperse the abrasive, and a polishing accelerator configured to accelerate the polishing. The polishing accelerator includes an organic acid containing an amine group and a carboxylic group. According to the slurry in accordance with an exemplary embodiment, a polishing rate of the cobalt may increases without using an oxidizing agent, and local corrosion defects on a surface of the cobalt may be suppressed.

18 Claims, 7 Drawing Sheets

| Classification | Contents | Sort |
|---|---|---|
| Neutral amino acid | Same number of $-NH_2$ and $-COOH$ | Alanine, Glycine, Serine, Leucine, Isoleucine, Tyrosine, Valine |
| Acidic amino acid | Number of $-COOH$ is greater than that of $-NH_2$ | Aspartic acid, Asparagine, Glutamic acid, Glutamine |
| Basic amino acid | Number of $-NH_2$ is greater than that of $-COOH$ | Arginine, Histidine, Lysine |

FIG. 7

| Slurry pH | Conductivity [uS/cm$^2$] |
|---|---|
| 2 | 7.58E+03 |
| 3 | 793 |
| 4 | 92 |
| 5 | 94 |
| 6 | 95.3 |
| 7 | 122.8 |
| 8 | 131.5 |
| 9 | 155 |
| 10 | 163 |
| 11 | 326 |
| 12 | 2722 |
| 13 | 2.22E+04 |

FIG. 8

| Slurry | | | | Co Polishing rate [Å/min] | SiO$_2$ Polishing rate [Å/min] | Selectivity [Co/SiO$_2$] |
|---|---|---|---|---|---|---|
| Abrasive ZrO$_2$ [wt%] | Dispersing agent PAA-based [wt%] | Polishing accelerator Arginine [wt%] | pH | | | |
| 1 | 0.375 | 0 | 10 | 400 | 420 | 1 |
| | | 0.001 | | 790 | 250 | 3 |
| | | 0.01 | | 850 | 233 | 4 |
| | | 0.03 | | 1006 | 178 | 6 |
| | | 0.07 | | 1125 | 115 | 10 |
| | | 0.1 | | 1406 | 68 | 21 |
| | | 0.3 | | 1775 | 52 | 34 |
| | | 0.5 | | 2065 | 25 | 83 |
| | | 0.7 | | 1080 | 21 | 51 |
| | | 1 | | 1040 | 15 | 69 |
| | | 2 | | 655 | 11 | 60 |

POLISHING SLURRY AND SUBSTRATE POLISHING METHOD USING THE SAME

CROSS-REFERENCE TO RELATED APPLICATION

This application claims priority to Korean Patent Application No. 10-2015-0038930 filed on Mar. 20, 2015 and all the benefits accruing therefrom under 35 U.S.C. §119, the contents of which are incorporated by reference in their entirety.

BACKGROUND

The present disclosure relates to polishing slurry, and more particularly, to polishing slurry that is capable of being used for planarizing cobalt through chemical mechanical polishing in a semiconductor manufacturing process and a substrate polishing method using the same.

As semiconductor devices are gradually reduced in size, and the number of metal lines gradually increases, surface irregularity on each of layers may be transferred onto the next layer. Thus, surface roughness of the lowermost layer becomes more and more important. The roughness may have a serious influence on processes to cause such a difficulty as to perform a photolithography process in following processes. Thus, to improve yield of semiconductor devices, a planarization process for removing the roughness on the irregular surface, which occurs in several processes, may be essentially performed. The planarization process may include various processes such as a reflow process after a thin film is formed, an etch-back process after a thin film is formed, and a chemical mechanical polishing (CMP) process.

The chemical mechanical polishing process may represent a process of providing an abrasive and slurry containing various compounds to perform a polishing process on a surface of a semiconductor wafer while the surface of the semiconductor wafer contacts a polishing pad to rotate, thereby planarizing the surface of the semiconductor wafer. That is, the chemical mechanical polishing process may represent a process of chemically and mechanically polishing a substrate or a surface of a layer on the substrate by using slurry and a polishing pad to planarize the substrate or the surface of the layer on the substrate.

In general, in a process of polishing a metal, a process of forming metal oxide $MO_x$ by using an oxidizing agent and a process of removing the formed metal oxide by using an abrasive are repeatedly performed. A process of polishing a cobalt layer, which is increasing in utilization as a line for a semiconductor device, may also be performed by a mechanism in which a process of forming cobalt oxide by using an oxidizing agent and a process of removing the formed cobalt oxide by using an abrasive are repeatedly performed.

Also, an insulating film or a pattern such as a trench may be formed on a lower portion of the cobalt layer. In this case, high polishing selectivity between the cobalt layer and the insulating film is required in the polishing process. That is, slurry that well polishes the cobalt layer, but does not well polish the insulating film may be required.

In accordance with the related art, to polish the cobalt, alumina or silica particles are used as the abrasive, and slurry is used as the oxidizing agent. However, if the slurry is used, corrosion defects (corrosion pit) in which a surface of the cobalt is dug due to local corrosion on the surface of the cobalt may occur. The corrosion defects may have a bad influence on quality of the device to be manufactured. Thus, a method in which a corrosion inhibitor is additionally added to the slurry used for polishing the cobalt has been proposed. However, according to this method, compositions of the slurry may be complicated, and components of the slurry have a difficulty in control. Also, since the oxidizing agent is used as ever, it may be difficult to completely solve the corrosion limitation. Also, the slurry for polishing the cobalt in accordance with the related art may not sufficiently realize the polishing selectivity of the cobalt to the insulating film.

Slurry for polishing cobalt, to which a corrosion inhibitor is added, is disclosed in US Patent Publication No. 2013-00186850.

SUMMARY

The present disclosure provides slurry for polishing cobalt and a substrate polishing method using the same.

The present disclosure also provides slurry for polishing cobalt, which is capable of preventing or inhibiting an occurrence of corrosion defects and a substrate polishing method using the same.

In accordance with an exemplary embodiment, slurry for polishing cobalt includes: an abrasive configured to perform the polishing, the abrasive including zirconium oxide particles; a dispersing agent configured to disperse the abrasive; and a polishing accelerator configured to accelerate the polishing, wherein the polishing accelerator includes an organic acid containing an amine group and a carboxylic group.

The abrasive may be contained in a range of 0.1 wt % to 10 wt % with respect to the total weight of the slurry and contained in a range of 0.4 wt % to 3 wt % with respect to the total weight of the slurry.

The dispersing agent may be contained in a range of 0.01 wt % to 5 wt % with respect to the total weight of the slurry and contained in a range of 0.15 wt % to 1 wt % with respect to the total weight of the slurry.

The polishing accelerator may be contained in a range of 0.1 wt % to 2 wt % with respect to the total weight of the slurry and contained in a range of 0.3 wt % to 1 wt % with respect to the total weight of the slurry. Also, the polishing accelerator may include an amino acid, and a functional group of a side chain of the amino acid may have a positive charge. The polishing accelerator may have a functional group having a positive charge by giving a hydrogen ion and a functional group having a negative charge by releasing a hydrogen ion in a pH alkali region. Also, the polishing accelerator may include at least one of arginine, histidine, lysine, aspartic acid, asparagine, glutamic acid, glutamine, alanine, glycine, leucine, isoleucine, valine, serine, and tyrosine.

The slurry may further include a pH regulating agent, and a pH of the slurry is regulated to 8 to 15, and a pH of the slurry is regulated to 9 to 12.5.

In accordance with another exemplary embodiment, slurry for polishing nonoxidizing cobalt, which polishes the cobalt without using an oxidizing agent includes: zirconium oxide particles as an abrasive configured to perform the polishing; and a polishing accelerator configured to regulate polishing characteristics of the cobalt and materials except for the cobalt, wherein the polishing accelerator has at least two functional groups different from each other, and the polishing accelerator has a functional group having a positive charge by giving a hydrogen ion and a functional group having a negative charge by releasing a hydrogen ion in a pH alkali region.

The materials except for the cobalt may include an insulating material, and the functional group comprises an amine group and a carboxylic group, and the amine group may be bonded to the insulating material to suppress polishing of the insulating material.

The polishing accelerator may include an amino acid, and the functional group comprises an amine group and a carboxylic group, and the amine group and the carboxylic group may be boned to the same carbon atom. Also, the amine group and the carboxylic group may have the same number or numbers different from each other. The number of amine groups may be greater than that of carboxylic groups.

The slurry may further include a pH regulating agent, and a pH of the slurry may be regulated to 9 to 11. Also, the slurry may further include a dispersing agent, and the dispersing agent may include at least one of cationic, anionic, and nonionic polymer materials.

In accordance with yet another exemplary embodiment, a substrate polishing method includes: preparing a substrate on which a cobalt film is formed; preparing slurry comprising an abrasive having zirconium oxide particles and a polishing accelerator containing an amine group and a carboxylic group; and polishing the cobalt film while supplying the slurry onto the substrate, wherein, in the polishing of the cobalt film, an amphoteric ion in which the amine group has a positive charge by giving a hydrogen ion, and the carboxylic group has a negative charge by releasing a hydrogen ion is generated, and the amine group suppresses polishing of a material except for the cobalt film.

The preparing of the substrate on which the cobalt film is formed may include: forming an insulating film on the substrate by using the material except for the cobalt film; forming a trench in the insulating film; and forming the cobalt film on an entire surface of the insulating film having the trench.

The polishing process may be performed in a pH alkali region and include: forming a cobalt oxide film on a top surface of the cobalt film; polishing the cobalt oxide film by using the abrasive; and bonding the polishing accelerator to cobalt.

BRIEF DESCRIPTION OF THE DRAWINGS

Exemplary embodiments can be understood in more detail from the following description taken in conjunction with the accompanying drawings, in which:

FIG. 7 is a table showing conductivity depending on a pH of the slurry;

FIG. 8 is a table showing results of polishing using the slurry in accordance with an exemplary embodiment;

DETAILED DESCRIPTION OF EMBODIMENTS

Figure 1:
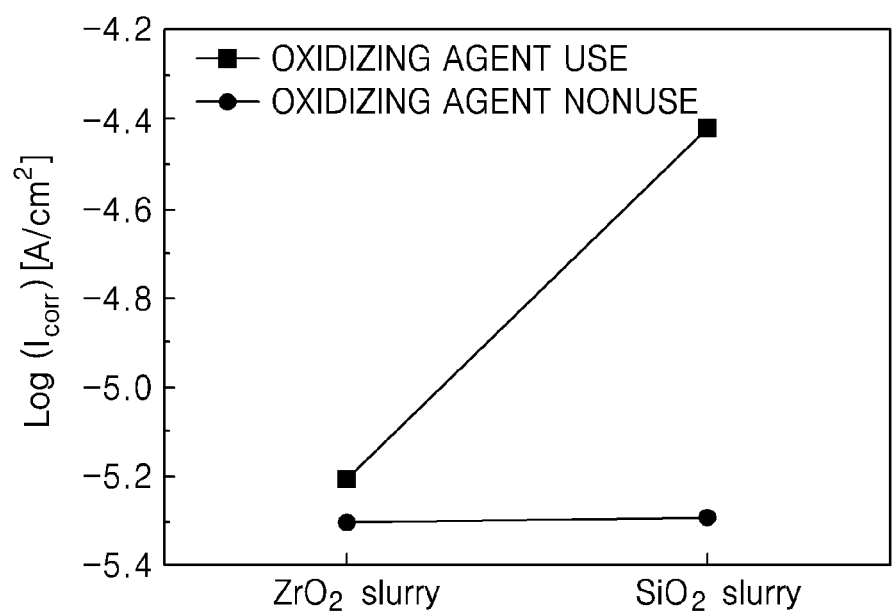
FIG. 1 is a view for comparing current in accordance with an exemplary embodiment to current in accordance with the related art.

Hereinafter, specific embodiments will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the figures, the dimensions of layers and regions are exaggerated for clarity of illustration. Like reference numerals refer to like elements throughout.

Slurry in accordance with an exemplary embodiment may be provided as slurry for polishing cobalt. The slurry include an abrasive for polishing and a polishing accelerator for adjusting polishing characteristics of the cobalt and materials except for the cobalt. Also, the slurry may include a dispersing agent for dispersing the abrasive, and the polishing accelerator may include an organic acid containing an amine group and a carboxyl group.

Here, the abrasive, the dispersing agent, and the polishing accelerator may be contained in a solution. For example, the abrasive, the dispersing agent, and the polishing accelerator may be dispersed and distributed in water, i.e., DI water. Also, to regulate a pH of the slurry, a pH regulating agent may be further contained. The slurry has a shape in which the abrasive is dispersed in a liquid, and each of components is adequately adjusted in content. The oxidizing agent may not be contained in the slurry, but may be separately provided with respect to the slurry and then be added into the slurry just before the polishing process. That is, the slurry may be nonoxidizing slurry that does not use the oxidizing agent.

The abrasive may include polishing particles in which zeta potential is positive (+). For example, the polishing particles may include zirconium oxide, i.e., zirconium ($ZrO_2$) particles. Each of the zirconium particles may have a crystalline phase and also have a polyhedral shape having crystalline surfaces. In case of colloidal silica that is mainly used as the typical abrasive, as illustrated in the drawing, the colloidal silica is distributed with a size of 40 nm to 70 nm and has a mean size of 38.5 nm. However, the zirconium particle that are used in an exemplary embodiment may have a crystalline phase having a nonoclinic structure and also have the polyhedral shape having the crystalline surfaces. Also, the zirconium particle may have a secondary particle size of 350 nm or less. In this case, the zirconium particles may be uniformly and stably dispersed in the slurry. For example, the zirconium particle may have a second particle size ranging from 200 nm to 310 nm. Here, the zirconium particles may have superior dispersion stability. Also, the abrasive may be contained in a range of 0.1 wt % to 10 wt % with respect to the total weight of the slurry. When the abrasive has a content of less than 0.1 wt %, the polishing may be difficult, or the cobalt may not be sufficiently polished because of a low polishing rate. When the abrasive has a content exceeding 10 wt %, the abrasive particles may cause trouble in dispersion stability, and the secondary particle size may be too large to cause scratch. Particularly, the zirconium particles may be contained in a range of 0.3 wt % to 5 wt % or contained in a range of 0.4 wt % to 3 wt % with respect to the total weight of the slurry. This is done because a polishing rate of the cobalt is superior, and the dispersion stability is secured in the range of 0.3 wt % to 5 wt %, and the polishing rate of the cobalt is more superior in the range of 0.4 wt % to 3 wt %. Here, since the zirconium abrasive particles is used as the abrasive, mechanical polishing may be superiorly performed in a chemical mechanical polishing process. Thus, an occurrence of dishing may be suppressed or prevented, and the number of complicated stages of the polishing process may be reduced to realize a single-stage polishing process.

Also, if zirconia is used as the abrasive, an occurrence of corrosion defects on a surface of the cobalt that is a target to be polished may be suppressed or prevented. This will be described below in detail.

Figure 2:
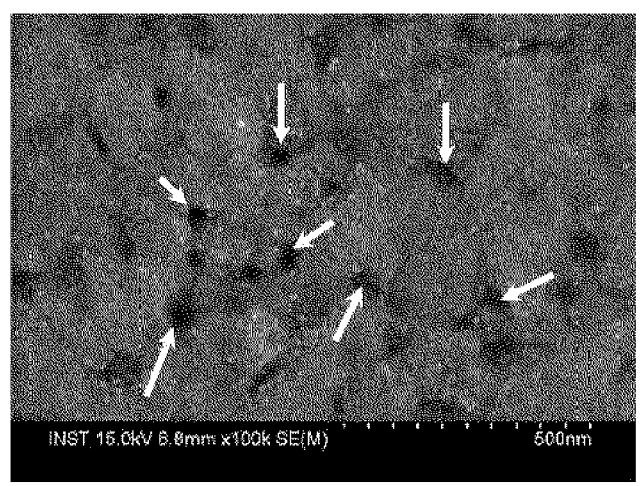
FIGS. 2 and 3 are electron microscope photographs of surfaces of cobalt, which are polished by using the slurry in accordance with the related art and the slurry in accordance with an exemplary embodiment.
Figure 3:
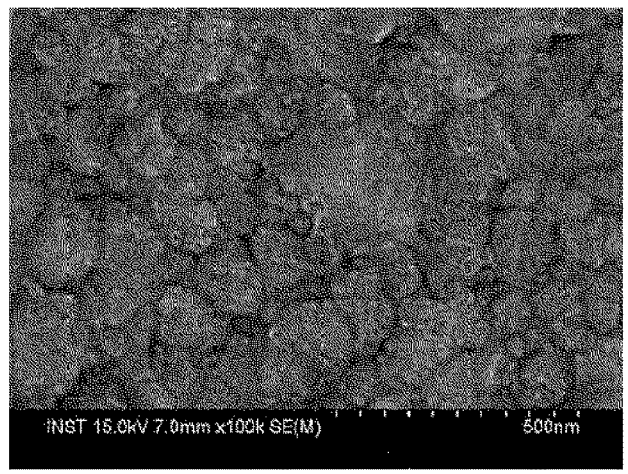

FIG. 1 is a view for comparing current in accordance with an exemplary embodiment to current in accordance with the related art, and FIGS. 2 and 3 are electron microscope photographs of surfaces of cobalt, which are polished by using the slurry in accordance with the related art and the slurry in accordance with an exemplary embodiment. FIG. 2 is an electron microscope photograph of a surface of cobalt polished by using slurry that uses silica abrasive particles, and FIG. 3 is an electron microscope photograph of a surface of cobalt polished by using slurry that uses zirconia abrasive particles.

FIG. 1 is a view showing results obtained by measuring current between slurry and a cobalt film under each of conditions to search corrosion behavior between the slurry and the cobalt film. Here, the used slurry may have the same ph, i.e., a pH of 10. The measured current may represent corrosion current at which each of the slurry acts on the cobalt film. Since high corrosion current represents a high reaction rate at which the cobalt film is dissociated, possibility of an occurrence of the corrosion defects, i.e., corrosion pit may increase.

As illustrated in FIG. 1, when the zirconia is used as the abrasive particles, a variation in corrosion current may be vary low regardless of use of the oxidizing agent. However, when the silica is used as the abrasive particles, if the oxidizing agent is not used, the corrosion current may be low, like the zirconia. However, if the oxidizing agent is used, it is seen that the corrosion current significantly increases (6.15 times in case of the zirconia). Thus, corrosion defect occurrence probability may significantly increase. Also, in case of the silica slurry, the oxidizing agent has to be essentially added to polish the cobalt film. Thus, when the cobalt film is polished by using the silica slurry, the corrosion defects may occur. When the cobalt film is polished by using slurry containing the silica abrasive and the oxidizing agent, as illustrated in the photograph of FIG. 2, it is observed that a plurality of corrosion defects (expressed as an arrow) occur on a surface of the cobalt film that remains after the polishing. On the other hand, when the zirconia is used as the abrasive particles, it is observed that all the corrosion defects are significantly reduced regardless of use of the oxidizing agent. Also, as illustrated in the photograph of FIG. 3, when the cobalt film is polished by using slurry containing the zirconia abrasive without adding the oxidizing agent, the corrosion defects may not nearly observed.

Thus, when the cobalt is polished, if the zirconia abrasive is used, the corrosion detects may be prevented or suppressed. Thus, it is seen that the cobalt is very efficiently polished without using the oxidizing agent.

The dispersing agent may uniformly disperse the abrasive into the slurry and use cationic, anionic, and nonionic polymer materials. Also, the dispersing agent may adjust zeta potential of the abrasive. That is, a cationic dispersing agent may increase the zeta potential of the abrasive to positive potential, and the anionic dispensing agent may decrease the zeta potential of the abrasive to negative potential. Also, a nonionic dispersing agent may maintain the zeta potential as it is. Thus, the zeta potential of the abrasive may be maintained at it is according to the dispensing agent contained in the slurry or may be finely adjusted to the positive potential or the negative potential. The cationic polymer dispersing agent may include at least one selected from the group consisting of polylysine, polyethyleneimine, benzethonium chloride, bronidox, cetrimonium bromide, cetrimonium chloride, dimethyldioctadecylammonium chloride, tetramethylammonium hydroxide, distearyl dimethyl ammonium chloride, polydimethylamine-co-epichlorohydrin, 1,2-dioleoyl-3-trimethylammonium propane, and poly allyl amine. Also, the anionic polymer dispersing agent may include at least one selected from the group consisting of polyacrylic acid, polycarboxylic acid, sodium dodecyl benzenesulfonate, sodium dodecyl sulfate, and sodium polystyrene sulfonate. Also, the nonionic dispersing agent may include at least one selected from the group consisting of polyvinyl pyrrolidone, polyethylene oxide, polyvinyl alcohol, hydroxyethyl cellulose, 2-amino-2-methyl-1-propanol, β-cyclodextrin, fructose, glucose, and galactose. The dispersing agent may be contained in a range of 0.01 wt % to 5 wt % with respect to the total weight of the slurry. When the dispersing agent has a content of less of 0.01 wt %, the dispersing may not be well performed and be deposited. When the dispersing agent has a content exceeding 5 wt %, the dispersion stability of the slurry may be deteriorated due to agglutination and high ionization concentration of the polymer material. Also, the dispersing agent may be contained in a range of 0.15 wt % to 1 wt % or contained in a range of 0.3 wt % to 0.7 wt % with respect to the total weight of the slurry. This is done because the dispersion stability is superior, and the zeta potential of the abrasive is capable of being finely adjusted.

The polishing accelerator may accelerate the polishing of a material that is a target to be polished and suppress the polishing of a material except for the target to be polished. That is, each of functional groups containing the polishing accelerator may act on each of the polishing target material and the material except for the polishing target material to regulate polishing characteristics of each of the materials. For example, when the cobalt is polished by using the slurry containing the polishing accelerator, the polishing accelerator may react with and be boned to the cobalt to accelerate the polishing of the cobalt and suppress the polishing of the material except for the cobalt such as an insulating film. Thus, a difference in polishing rate between the cobalt and the insulating film may increase to improve the polishing selectivity. An organic acid having a carboxylic group and an amine group may be used as the polishing accelerator. The polishing accelerator may contain an amino acid so that a functional ground disposed in a side chain of the amino acid has a positive charge. Also, the polishing accelerator may have at least two functional groups different from each other. The functional groups may be a functional group having a positive charge by giving a hydrogen ion and a functional group having a negative charge by releasing a hydrogen ion in a pH alkali region, respectively.

Figure 4:
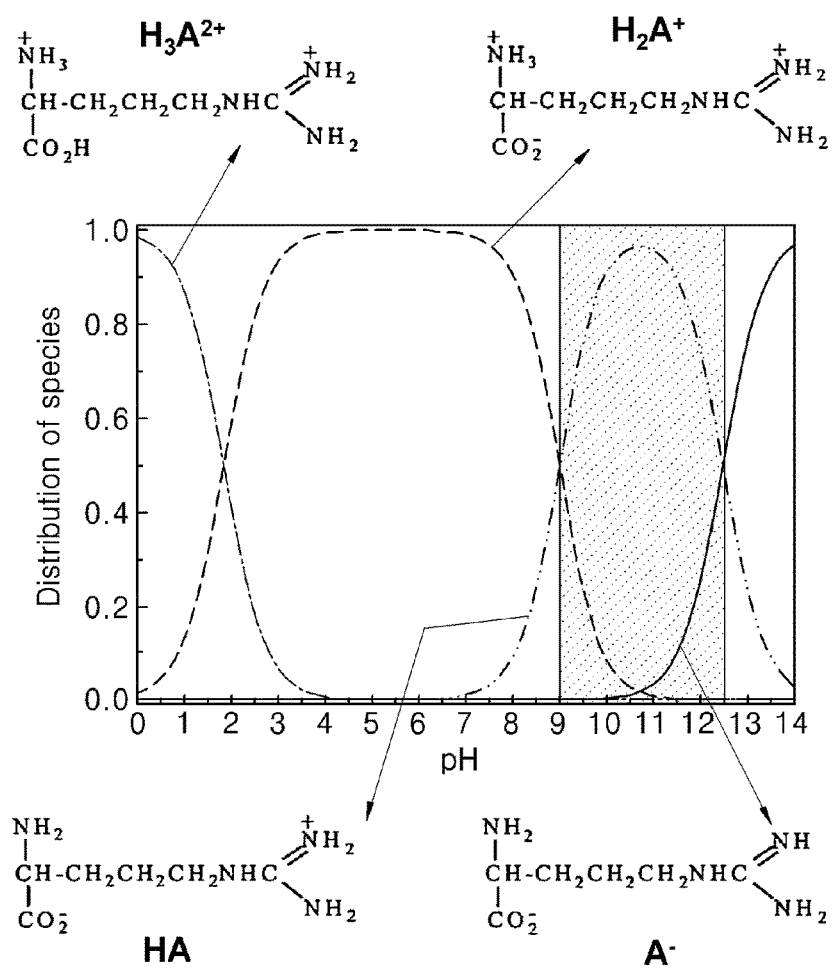
FIG. 4 is a graph illustrating a distribution of species depending on a pH of an organic acid that is used in the slurry in accordance with an exemplary embodiment.

When arginine is used as the polishing accelerator, an effect of the functional group will be described as an example. First, FIG. 4 is a graph illustrating a distribution of species depending on a pH of an organic acid that is used in the slurry in accordance with an exemplary embodiment. Arginine may exist in various forms according to a pH region. Also, as illustrated in FIG. 4, the arginine may have an HA form in a region of a pH of 9 to 12.5, and one amine group and one carboxylic group may be dissociated to have the form of an amphoteric ion. That is, the arginine may exist in the form of the amphoteric ion because the amine group has a positive charge value by giving a hydrogen ion, and the carboxylic group has a negative charge value by releasing a hydrogen ion in a specific pH region (9 to 12.5). Here, the surface of the cobalt in the ph region may have the form of $Co_3O_4$ or $Co(OH)_2$, $Co(OH)_3$ (this will be described later). That is, the surface of the cobalt in the corresponding region may be easily bonded to oxygen, and the cobalt may exist in an oxide or hydroxide state that is in a state in which the cobalt is well polished when compared to a metal state. Also, each of the functional groups of the arginine may be bonded to cobalt ions to accelerate an oxidation reaction of the cobalt, thereby increasing the polishing rate of the cobalt. That is, the amine group of the arginine is covalent-bonded to cobalt divalent ions, and the carboxylic group is ion-bonded to cobalt divalent ions. Thus, when the polishing accelerator is used, the polishing rate of the cobalt may be improved when compared to a case in which only the abrasive is used. The amine group having the positive charge may act on the insulating film (e.g., a silicon oxide film) having the negative charge to prevent the insulating film from being decomposed, thereby suppressing a polishing rate of the insulating film. That is, the amine group may be boned to the silicon oxide to prevent the silicon oxide film from being decomposed into the form of $Si(OH)_4$, thereby reducing a polishing rate of the silicon oxide. Thus, when the above-described organic acid is used as the polishing accelerator, the polishing of the cobalt that is a target to be polished may be accelerated, and the polishing of the material except for the target to be polished, e.g., the insulating film may be suppressed.

Figures 5, 6:
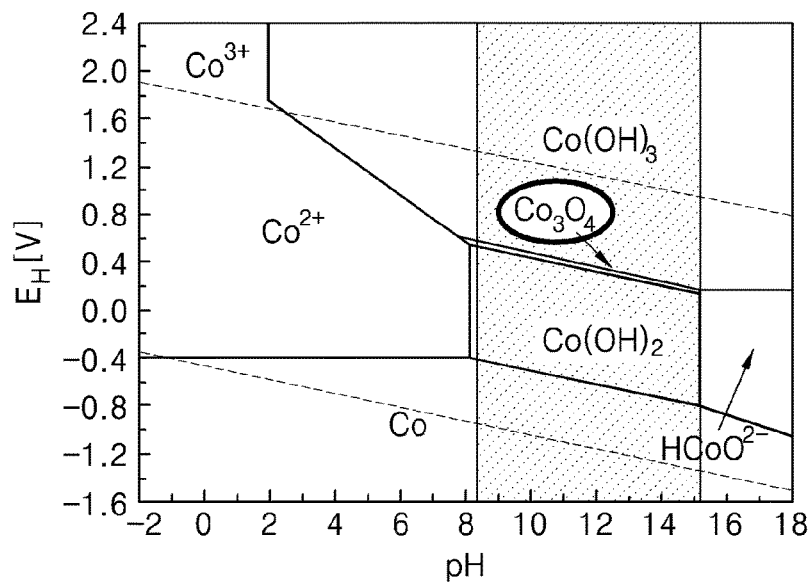
FIG. 5 is a classified table of the organic acid that is used in the slurry in accordance with an exemplary embodiment.
FIG. 6 is a pourbaix diagram of the cobalt.

Various organic acids having the carboxylic group and the amine group may be used as the polishing accelerator. For example, the polishing accelerator may include at least one of arginine, histidine, lysine, aspartic acid, asparagine, glutamic acid, glutamine, alanine, glycine, leucine, isoleucine, valine, serine, and tyrosine. Each of the organic acids may be used alone. Alternatively, the organic acids may be mixed with each other and then used. FIG. 5 illustrates classification of the organic acids. As illustrated in FIG. 5, each of the organic acids includes at least one carboxylic group (COOH) and amine group ($NH_2$). Also, each of the organic acids may be a neutral amino acid having the same number of carboxylic groups and amine groups, an acidic amino acid in which the number of carboxylic groups is greater than that of amine groups, or a basic amino acid in which the number of amine groups is greater than that of carboxylic groups. Here, the amine group may react with the target to be polished, i.e., the cobalt and also react with the material except for the target to be polished, i.e., the insulating film. Thus, that the number of amine groups is large may be advantageous. For example, the basic amino acid in which the number of amine groups is greater than that of carboxylic groups may further improve polishing performance of the slurry. Also, the organic acid may further include other functional groups in addition to the amine group and the carboxylic group. For example, the organic acid may further include a hydroxyl group (OH) and a hydrophobic group (H). Also, the organic acid may further include aromatic hydrocarbon. The polishing accelerator may have a content of approximately 0.1 wt % to approximately 2 wt % with respect to the total weight of the slurry. If the polishing accelerator has a content of less than 0.1 wt %, since a polishing rate of the insulating film, e.g., the silicon oxide film is high, polishing selectivity between the cobalt and the insulating film may be poor. If the polishing accelerator has a content exceeding 2 wt %, since the polishing rate of the cobalt is significantly reduced, it may be difficult to effectively polish the cobalt. When the polishing accelerator has a content of 0.3 wt % to 1 wt %, polishing selectivity that is obtained by dividing the cobalt polishing rate by the insulating film polishing rate is 30 or more, and thus, high selectivity may be achieved. Also, when the polishing accelerator has a content of 0.5 wt % to 1 wt %, polishing selectivity between the cobalt and the insulating film is 50 or more, and thus, higher selectivity may be achieved.

Since the typical cobalt slurry uses the oxidizing agent, a corrosion inhibitor for inhibiting local corrosion occurring on the target to be polished, e.g., the surface of the cobalt is used. However, in an exemplary embodiment, the corrosion inhibitor is not used.

The pH regulating agent may regulate a pH of the slurry. The pH regulating agent may mainly include ammonia water and potassium hydroxide (KOH). In an exemplary embodiment, a pH of the slurry may be regulated to an alkali region by using the pH regulating agent. That is, the pH of the slurry may be regulated to exceed a pH of 7. Also, the pH of the slurry may be regulated in a range of 8 to 15, a range of 9 to 12.5, or a range of 9 to 11. The reason in which the pH is regulated may be seen through FIG. 6 that illustrates a pourbaix diagram of the cobalt. In potential with respect to a pH, which is illustrated in FIG. 6, when a pH is less than 8, since the form of the cobalt divalent ions becomes a stable state, corrosion may occur on the cobalt. When a pH is reduced to 2 or less, cobalt divalent and trivalent ions may be formed to cause more serious corrosion. Also, when a pH exceeds 15, the cobalt oxide film may exist in the form of ion to cause corrosion. On the other hand, when a pH ranges of 8 to 15, cobalt oxide ($CO_3O_4$) and cobalt hydroxide may be formed. Thus, it is seen that the corrosion is inhibited, and the cobalt is easily polished in this region. That is, cobalt oxide that is softer than the cobalt may be formed in the corresponding alkali region (expressed by using shade in the drawing), and thus, if the polishing is performed in this region, the polishing rate may increase. Also, the cobalt oxide film formed on the surface may suppress an occurrence of the surface corrosion defects of the cobalt. Thus, the slurry in accordance with an exemplary embodiment may regulate a pH to 8 to 15 by using the pH regulating agent. Thus, the cobalt may be easily polished or etched.

To prevent the cobalt from corroding, conductivity of the slurry may be adequately adjusted. If the conductivity of the slurry is too high, the corrosion current may increase to increase possibility of corrosion on the surface of the cobalt. FIG. 7 is a table showing conductivity depending on the pH of the slurry. As illustrated in FIG. 7, the conductivity of the slurry may vary according to a pH. Also, it is seen that desired conductivity is obtained by regulating a pH. When the cobalt is polished, the alkali region in which a pH ranges of 8 to 15 may be useful as described above. However, if a pH exceeds 12, as illustrated in FIG. 7, the conductivity of the slurry may significantly increase to increase the corrosion current. Thus, it may be predicted that possibility of an occurrence of the corrosion defects on the surface of the cobalt increases. Also, if the conductivity of the slurry is too low, the various functional groups may not properly act.

Thus, a pH of the slurry for polishing the cobalt may be regulated to a pH of 8 to 12 or a pH of 9 to 11. As a result, the adequate conductivity may be achieved.

As described above, the pH of the slurry for polishing the cobalt may be regulated to the alkali region through various factors. That is, to regulate at least one of the reaction and action of the functional groups of the polishing accelerator, the existing state (oxide formation) of the cobalt, and the conductivity of the slurry, the pH of the slurry may be regulated to an adequate range. Thus, the polishing of the cobalt may be accelerated, and the polishing of the insulating film that is not a target to be polished may be suppressed to prevent the surface of the cobalt from locally corroding.

Hereinafter, results obtained by evaluating polishing characteristics when the slurry in accordance with the foregoing embodiment is manufactured and then applied to the semiconductor substrate will be described.

Experimental Example

Since a process of manufacturing slurry is similar to that of manufacturing general slurry, the process of manufacturing the slurry will be simply described. First, a container to be used for manufacturing slurry was prepared, and a desired amount of deionized (DI) water and a desired amount of polyacrylic acid that is a dispersing agent were put into the container and then sufficiently mixed with each other. Then, a predetermined amount of zirconia particle having a crystalline phase and a predetermined primary particle mean size as an abrasive was measured and put and then uniformly mixed. Also, a predetermined amount of arginine as a polishing accelerator was put into the container and then uniformly mixed. Then, a potassium hydroxide pH regulating agent was put into the container to regulate a pH. The putting and mixing of these materials are not specifically limited in order. In this experimental example, the zirconia particles and the dispersing agent were put to respectively have contents of 1 wt % and 0.375 w % with respect to the total weight of the slurry. Also, the polishing accelerator was put in a range of 0 wt % to 2 wt %. That is, a plurality of slurry were prepared in accordance with an amount of input of the polishing accelerator. Each of slurry regulated to have a pH of 10 by using the potassium hydroxide. The remainder except for the above-described components may include impurities and pure water, which are unavoidably added.

Also, a plurality of wafers each of which has a size of 12 inch, which will be polished by using the slurry in accordance with the experimental example were prepared. That is, a cobalt wafer on which 6,000 Å of a cobalt film is deposited after 1,000 Å of an oxide film and 1,000 Å of nitride titanium are deposited on a silicon wafer was prepared. Also, an oxide wafer on which 7,000 Å of a silicon oxide film as an insulating film is deposited was prepared. Here, a Poli-762 polisher (G&P Technology Inc.,) was used as polishing equipment, and IC 1000/Suba IV CMP of Rohm & Haas was used. Also, each of the cobalt film and the oxide film was polished for 60 seconds under the following polishing conditions. A head pressure was 4 psi, speeds of a head and a spindle table were 93 rpm and 87 rpm, respectively, and a flow speed of the slurry was 100 ml/min.

Figure 9:
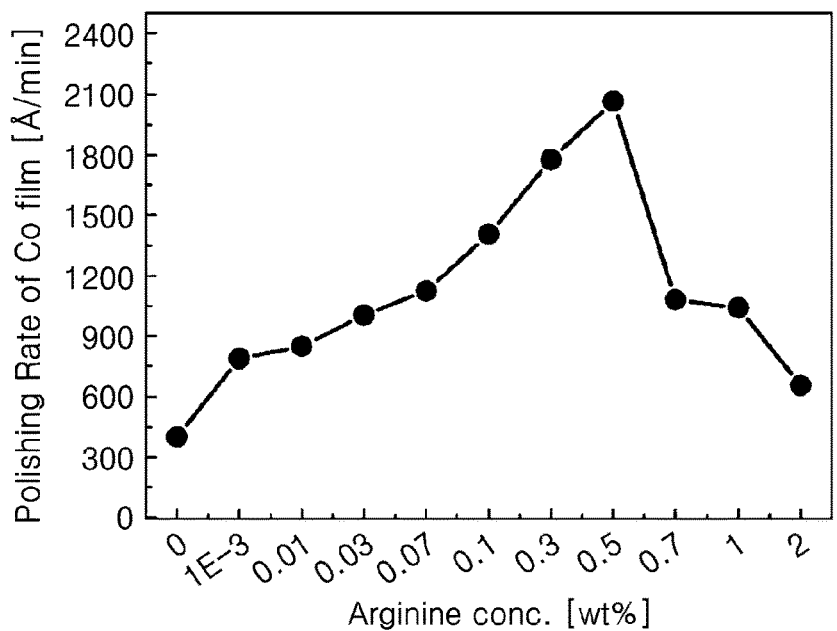
FIG. 9 is a graph illustrating a polishing rate of the cobalt depending a concentration of a polishing accelerator.
Figure 10:
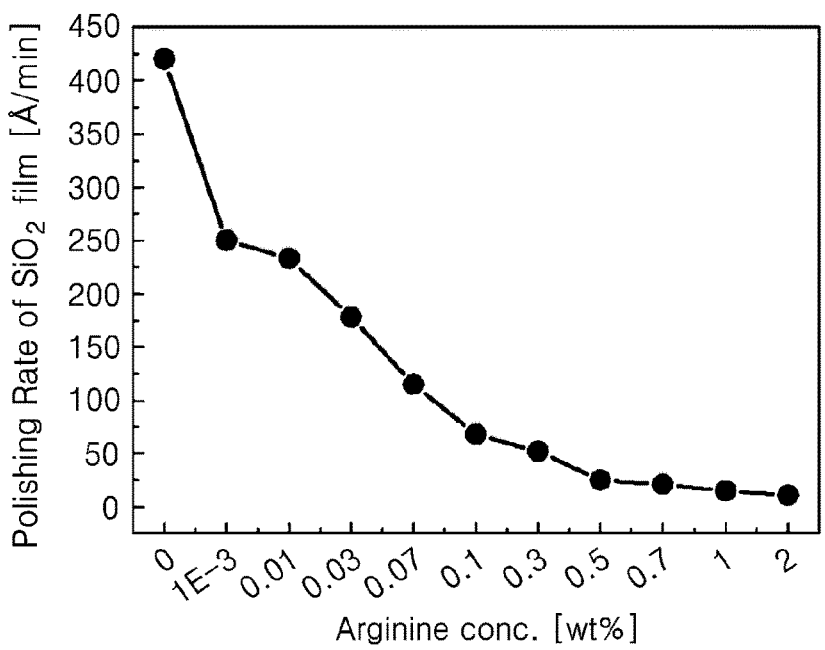
FIG. 10 is a graph illustrating a polishing rate of an insulating oxide film depending on a concentration of the polishing accelerator.

FIG. 8 is a table showing results of polishing using the slurry in accordance with an exemplary embodiment, FIG. 9 is a graph illustrating a polishing rate of the cobalt depending a concentration of a polishing accelerator, and FIG. 10 is a graph illustrating a polishing rate of an insulating oxide film (SiO$_2$) depending on a concentration of the polishing accelerator. FIG. 8 illustrates values of polishing rates and selectivity of cobalt and a silicon oxide film depending on a content of a polishing accelerator, and FIGS. 9 and 10 illustrate polishing rates of the cobalt and the silicon oxide film, respectively. Here, the polishing rates of the cobalt and the silicon oxide film are calculated by polishing a cobalt wafer and a silicon oxide film wafer, and the polishing selectivity is a ratio of the polishing rate of the oxide film to the polishing rate of the cobalt. That is, the polishing selectivity is a value obtained by dividing the polishing rate of the cobalt by the polishing rate of the silicon oxide film.

As seen in FIGS. 8 to 10, when an amount of polishing accelerator increases, the polishing rate of the cobalt may significantly increase. Then, when a predetermined amount or more of polishing accelerator is added, the polishing rate of the cobalt may decrease again. On the other hand, when an amount of polishing accelerator increases, the polishing rate of the silicon oxide film continuously decreases. That is, when the polishing accelerator is added, the polishing rate of the cobalt may significantly increase without using an oxidizing agent to achieve a polishing rate of 1,000 Å/min or more. Also, since the polishing rate of the cobalt increases, and the polishing rate of the silicon oxide film decreases by adding the polishing accelerator, high polishing selectivity may be achieved. Principles relating to this test have been described above. When the polishing accelerator has a content of 0.03 wt % or more, the polishing rate of the cobalt is high to 1,000 Å/min or more. Also, when the polishing accelerator has a content of 0.1 wt % or more, the polishing rate of the cobalt is high to 1,400 Å/min or more. When the polishing accelerator has a content of 0.5 wt % or more, the polishing rate of the cobalt is very high to 2,000 Å/min or more. When the polishing accelerator has a content of 0.7 wt % or more, the polishing rate of the cobalt began to decline. When the polishing accelerator has a content of 0.1 wt % to 2 wt %, the polishing selectivity is high to 20 or more. Also, when the polishing accelerator has a content of 0.3 wt % or more, the polishing selectivity is high to 30 or more. When the polishing accelerator has a content of 0.5 wt % or more, the polishing selectivity is very high to 50 or more.

The slurry in accordance with an exemplary embodiment may be used for the process of polishing the cobalt in the manufacturing process of the semiconductor device. The cobalt may be used for a buried gate and a line/plug. In case of the buried gas cobalt, a distance between cells may be small to 30 nm or less. In case of the line/plug cobalt, a distance between cells may be large to a range of 30 nm to 150 nm. Thus, the slurry having adequate polishing selectivity may be selected according to kinds of patterns to be polished to perform the polishing process. That is, the process of manufacturing the semiconductor device may be performed by using the slurry in which the polishing selectivity between the cobalt film and the oxide film is high. A method for manufacturing a semiconductor device by using the slurry in accordance with an exemplary embodiment will be described with reference to FIGS. 11 to 14.

Figure 11:
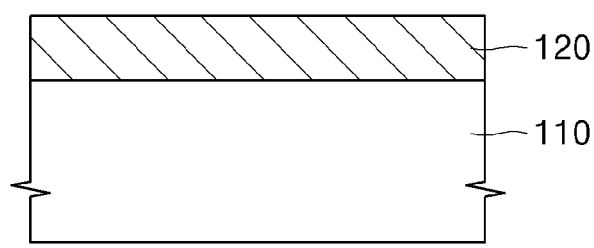
FIGS. 11 to 14 are a cross-sectional views for explaining a method for manufacturing a semiconductor device in accordance with an exemplary embodiment.
Figure 12:
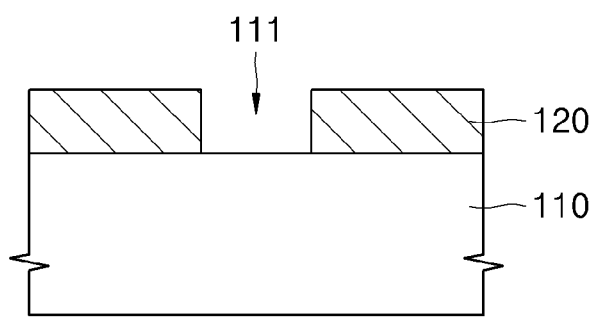

FIGS. 11 to 14 are cross-sectional views for explaining a method for manufacturing a semiconductor device in accordance with an exemplary embodiment. Referring to FIG. 11, an insulating film 120, e.g., a silicon oxide film is formed on a substrate 110. Referring to FIG. 12, a predetermined area of the insulating film 120 may be etched to form a pattern through which a predetermined area 111 of the substrate 110 is exposed. Various substrates that are used for manufacturing the semiconductor device may be used as the substrate 110. For example, a silicon substrate may be used. The insulating film 120 may be formed by using a silicon oxide film-based material. For example, the insulating film 120 may be formed by using at least one of boronphosphosilicate glass (BPSG), phosphosilicate glass (PSG), high density plasma (HDP), tetra ethyl ortho silicate (TEOS), undoped silica glass (USG), PETEOS, and high aspect ratio process (HARP). Also, the insulating film 120 may be formed by using a physical vapor deposition (PVD) method, a chemical vapor deposition (CVD) method, a metal organic CVD (MOCVD) method, an atomic film deposition (ALD) method, or an AL-CVD method in which the CVD method and the ALD method are combined with each other. The pattern may be a hole for exposing a predetermined area of the substrate 110 so as to a line and/or a plug or may be a trench having a line shape.

Figure 13:
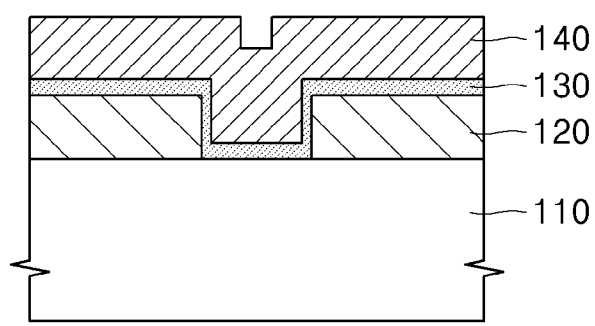

Also, as illustrated in FIG. 13, a barrier film 130 formed of nitride titanium may be formed on the substrate 110 including the pattern and the insulating film 120, and then, a cobalt film 140 may be formed on an entire surface of the barrier film 130 to bury the pattern.

Figure 14:
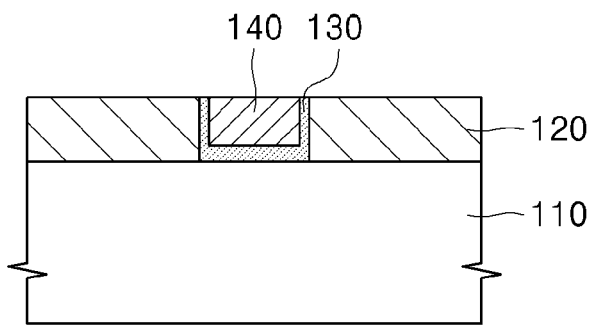

Referring to FIG. 14, the cobalt film 140 and the insulating film 120 are polished by using the slurry in which polishing selectivity between the cobalt film and the oxide film is high in accordance with an exemplary embodiment. The polishing selectivity between the cobalt film and the oxide film in the slurry may be high to about 30 or more. That is, in this polishing method, the slurry including a zirconium oxide particle that is an abrasive and the polishing accelerator containing a carboxylic group and an amine group is prepared, and the cobalt film 140 is polished while supplying the slurry onto the substrate. After the polishing, a structure in which the cobalt film is formed is manufactured in only a trench. The trench structure or line structure may be variously changed according to devices.

In the polishing process, an amphoteric ion in which the amine group has a positive charge by giving a hydrogen ion, and the carboxylic group has a negative charge by releasing a hydrogen ion may be generated, and the amine group may suppress the polishing of a material except for the cobalt film 140, i.e., a silicon oxide film 120. Also, the polishing process may be performed in a pH alkali region. The polishing process may include a process of forming a cobalt oxide film on a top surface of the cobalt film 140, a process of polishing the cobalt oxide film by using an abrasive, and a process of bonding the polishing accelerator to the cobalt. Also, in the polishing process, the amine group having the positive charge and the carboxylic group having the negative charge in the functional groups of the polishing accelerator may be bonded to cobalt ions to accelerate a dissociation reaction of the cobalt, thereby accelerating and increasing the polishing rate of the cobalt film. Thus, even though the slurry does not include the oxidizing agent, the polishing of the cobalt film 140 may be accelerated, and the polishing of the insulating oxide film 120 may be suppressed. Also, since the oxidizing agent is not used, the corrosion defects that may occur on the surface of the cobalt film 140 may be significantly prevented. Also, when the cobalt film 140 is polished by using the slurry having the superior polishing selectivity of the cobalt to the oxide film, the insulating film 120 may not be polished, and the cobalt film 140 may be polished. As a result, erosion may not nearly occur. Here, since the zirconia particles are used as the abrasive, the CMP process having superior mechanical performance may be performed to suppress the dishing.

In accordance with the exemplary embodiment, since the slurry including the zirconia particles as the abrasive is used, the corrosion defects on the cobalt surface may be inhibited or prevented. Also, if the zirconia abrasive is used, and the oxidizing agent is not used, the corrosion defects may be more effectively prevented. Also, the slurry using the zirconia particles may polish the cobalt at a sufficient polishing rate without using the oxidizing agent.

Also, in accordance with the exemplary embodiment, since the slurry in which the functional groups are adjusted by the polishing accelerator is used, the polishing rate of the cobalt may be improved, and the polishing rate of other materials except for the cobalt, e.g., the insulating film may be inhibited. As described above, the polishing rate of the insulating film may be inhibited to improve the polishing selectivity between the cobalt and the insulating film.

Also, in accordance with the exemplary embodiment, since the polishing selectivity is high, the excessive polishing of the cobalt and the insulating film may be inhibited. Therefore, the cobalt may be effectively polished through the simple polishing process, and thus, the polishing productivity may be improved.

Also, the defects such as the dishing and the erosion may be reduced, and the occurrence of the by-products may be inhibited. Thus, the semiconductor device to be manufactured may be improved in operation characteristic and reliability, and also, the total manufacturing productivity of the semiconductor device may be improved.

As described above, the technical idea of the present invention has been specifically described with respect to the above embodiments, but it should be noted that the foregoing embodiments are provided only for illustration while not limiting the present invention. Various embodiments may be provided to allow those skilled in the art to understand the scope of the preset invention, but the present invention is not limited thereto.

What is claimed is:

1. A slurry for polishing cobalt, the slurry comprising:
an abrasive configured to perform the polishing, the abrasive comprising zirconium oxide particles;
a dispersing agent configured to disperse the abrasive; and
a polishing accelerator which exists in the slurry in the form of an amphoteric ion and is configured to accelerate the polishing,
wherein the polishing accelerator comprises an organic acid containing an amine group and a carboxylic group, and an oxidizing agent for oxidizing the cobalt and a corrosion inhibitor for inhibiting corrosion of the cobalt are not used.

2. The slurry of claim 1, wherein the abrasive is contained in a range of 0.1 wt % to 10 wt % with respect to the total weight of the slurry.

3. The slurry of claim 1, wherein the dispersing agent is contained in a range of 0.01 wt % to 5 wt % with respect to the total weight of the slurry.

4. The slurry of claim 1, wherein the polishing accelerator is contained in a range of 0.1 wt % to 2 wt % with respect to the total weight of the slurry.

5. The slurry of claim 1, wherein the polishing accelerator comprises an amino acid, and a functional group of a side chain of the amino acid has a positive charge.

6. The slurry of claim 5, wherein the polishing accelerator has a functional group having a positive charge by giving a hydrogen ion and a functional group having a negative charge by releasing a hydrogen ion in a pH alkali region.

7. The slurry of claim 1, wherein the polishing accelerator comprises at least one of arginine, histidine, lysine, aspartic acid, asparagine, glutamic acid, glutamine, alanine, glycine, leucine, isoleucine, valine, serine, and tyrosine.

8. The slurry of claim 1, further comprising a pH regulating agent, and a pH of the slurry is regulated to 8 to 15.

9. A slurry for polishing nonoxidizing cobalt, which polishes the cobalt without using an oxidizing agent, the slurry comprises:
- zirconium oxide particles as an abrasive configured to perform the polishing; and
- a polishing accelerator which exists in the slurry in the form of an amphoteric ion and is configured to regulate polishing characteristics of the cobalt and materials except for the cobalt,
- wherein the polishing accelerator has at least two functional groups different from each other, and the polishing accelerator has a functional group having a positive charge by giving a hydrogen ion and a functional group having a negative charge by releasing a hydrogen ion in a pH alkali region, and a corrosion inhibitor for inhibiting corrosion of the cobalt is not used.

10. The slurry of claim 9, wherein the materials except for the cobalt comprise an insulating material, and the functional group comprises an amine group and a carboxylic group, and
- the amine group is bonded to the insulating material to suppress polishing of the insulating material.

11. The slurry of claim 9, wherein the polishing accelerator comprises an amino acid, and the functional group comprises an amine group and a carboxylic group, and the amine group and the carboxylic group are boned to the same carbon atom.

12. The slurry of claim 10, wherein, in the polishing accelerator, the number of amine groups is greater than that of carboxylic groups.

13. The slurry of claim 11, wherein, in the polishing accelerator, the number of amine groups is greater than that of carboxylic groups.

14. The slurry of claim 9, further comprising a pH regulating agent, and a pH of the slurry is regulated to 9 to 11.

15. The slurry of claim 9, further comprising a dispersing agent, and the dispersing agent comprises at least one of cationic, anionic, and nonionic polymer materials.

16. A substrate polishing method comprises:
preparing a substrate on which a cobalt film is formed;
preparing slurry comprising an abrasive having zirconium oxide particles and a polishing accelerator containing an amine group and a carboxylic group; and
polishing the cobalt film while supplying the slurry onto the substrate,
wherein, in the polishing of the cobalt film, an amphoteric ion in which the amine group has a positive charge by giving a hydrogen ion, and the carboxylic group has a negative charge by releasing a hydrogen ion is generated, and the amine group suppresses polishing of a material except for the cobalt film.

17. The substrate polishing method of claim 16, wherein the preparing of the substrate on which the cobalt film is formed comprises: forming an insulating film on the substrate by using the material except for the cobalt film; forming a trench in the insulating film; and forming the cobalt film on an entire surface of the insulating film having the trench.

18. The substrate polishing method of claim 16, wherein the polishing process is performed in a pH alkali region and comprises: forming a cobalt oxide film on a top surface of the cobalt film; polishing the cobalt oxide film by using the abrasive; and bonding the polishing accelerator to cobalt.

* * * * *